US010686532B2

(12) United States Patent
Guter et al.

(10) Patent No.: US 10,686,532 B2
(45) Date of Patent: Jun. 16, 2020

(54) OPTICAL RECEIVER COMPONENT

(71) Applicant: AZUR SPACE Solar Power GmbH, Heilbronn (DE)

(72) Inventors: Wolfgang Guter, Stuttgart (DE); Daniel Fuhrmann, Heilbronn (DE); Christoph Peper, Hannover (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 202 days.

(21) Appl. No.: 15/958,433

(22) Filed: Apr. 20, 2018

(65) Prior Publication Data

US 2018/0241478 A1     Aug. 23, 2018

Related U.S. Application Data

(63) Continuation of application No. PCT/EP2016/001638, filed on Oct. 4, 2016.

(30) Foreign Application Priority Data

Oct. 20, 2015   (DE) .................. 10 2015 013 514

(51) Int. Cl.
*H04B 10/69*   (2013.01)
*H01L 31/02*   (2006.01)
(Continued)

(52) U.S. Cl.
CPC ......... *H04B 10/69* (2013.01); *H01L 27/1443* (2013.01); *H01L 31/02019* (2013.01);
(Continued)

(58) Field of Classification Search
CPC . H04B 10/69; H01L 31/0687; H01L 31/0693; H01L 27/1443; H01L 31/02019; H01L 31/03046; Y02E 10/544
(Continued)

(56) References Cited

U.S. PATENT DOCUMENTS 4,127,862 A * 11/1978 Ilegems ................ H01L 31/101
                                                                       257/184
4,996,577 A    2/1991 Kinzer
(Continued)

FOREIGN PATENT DOCUMENTS

DE         10350112 A1    6/2004
DE    102010001420 A1    8/2011
(Continued)

OTHER PUBLICATIONS

International Search Report dated Feb. 1, 2017 in corresponding application PCT/EP2016/001638.
(Continued)

*Primary Examiner* — Seung C Sohn
(74) *Attorney, Agent, or Firm* — Muncy, Geissler, Olds & Lowe, P.C.

(57) ABSTRACT

An optical receiver component, wherein the receiver component comprises a first type of partial-voltage source with a first absorption edge and a second type of partial-voltage source with a second absorption edge, and the first absorption edge lies at a higher energy than the second absorption edge. Each partial-voltage source produces a partial voltage, provided a photon flux at a specific wavelength strikes the partial-voltage source, and the two partial-voltage sources are connected in series. A first number of series-connected sub-partial-voltage sources of the first type and a second number of series-connected sub-partial-voltage sources of the second type are provided. The first number and/or the second number are greater than one, and the respective deviation of the source voltages of the sub-partial-voltage sources among themselves is less than 20% in both types. Each sub-partial-voltage source comprises a semiconductor diode with a p-n junction.

20 Claims, 3 Drawing Sheets

(51) Int. Cl.
*H01L 31/0304* (2006.01)
*H01L 31/0687* (2012.01)
*H01L 31/0693* (2012.01)
*H01L 27/144* (2006.01)

(52) U.S. Cl.
CPC .... *H01L 31/03046* (2013.01); *H01L 31/0687* (2013.01); *H01L 31/0693* (2013.01); *Y02E 10/544* (2013.01)

(58) Field of Classification Search
USPC .......................................................... 250/551
See application file for complete search history.

(56) References Cited

U.S. PATENT DOCUMENTS

| | | | |
|---|---|---|---|
| 5,342,451 A * | 8/1994 | Virshup | H01L 31/0693 136/244 |
| 6,239,354 B1 | 5/2001 | Wanlass | |
| 6,316,715 B1 | 11/2001 | King et al. | |
| 6,340,788 B1 | 1/2002 | King et al. | |
| 6,806,482 B2 | 10/2004 | Yamagishi | |
| 7,812,249 B2 * | 10/2010 | King | H01L 31/1852 136/255 |
| 8,350,208 B1 | 1/2013 | Zhang et al. | |
| 8,742,251 B2 * | 6/2014 | Werthen | H01L 31/0693 136/249 |
| 8,809,877 B2 | 8/2014 | Guo | |
| 2006/0048811 A1 | 3/2006 | Krut et al. | |
| 2010/0059097 A1 | 3/2010 | McDonald et al. | |
| 2012/0266803 A1 | 10/2012 | Zediker et al. | |
| 2015/0162478 A1 * | 6/2015 | Fafard | H01L 31/0304 257/461 |

FOREIGN PATENT DOCUMENTS

| | | |
|---|---|---|
| EP | 1109230 A2 | 6/2001 |
| EP | 1134813 A2 | 9/2001 |
| EP | 1936700 A2 | 6/2008 |
| WO | WO2013067969 A1 | 5/2013 |

OTHER PUBLICATIONS

D. J. Friedman et al: "GaInNAs Junctions for Next-Generation Concentrators: Progress and Prospects". Proceedings of the international Conference on Solar Concentrators for the Generation of Electricity or Hydrogen, May 1, 2005, pp. 1-5, XP055338046, abstract; figure 2 section 3. Multijunction Cell Efficiency Projections; p. 2; table 2.

Yu Chen Yuan et al : "Responses of thin Film Photovoltaic Cell to Irradiation under Double Laser Beams of Different Wavelength", Materials Science Forum, vol. 743-744, Jan. 25, 2013, pp. 937-942, XP055337854, DOI 10.4028/scientific.net/MSF.743-744.937.

Nadar M. Kalkhoran, et al, "Cobalt disilicide intercell ohmic contacts for multijunction photovoltaic energy converters," Appl. Phys. Lett. 64, 1980 (1994).

A.Bett et al, "III-V Solar cells under monochromatic illumination," Photovoltaic Specialists Conference, 2008, PVSC '08.33$^{rd}$ IEEE, pp. 1-5, ISBN: 978-1-4244-1640-0.

* cited by examiner

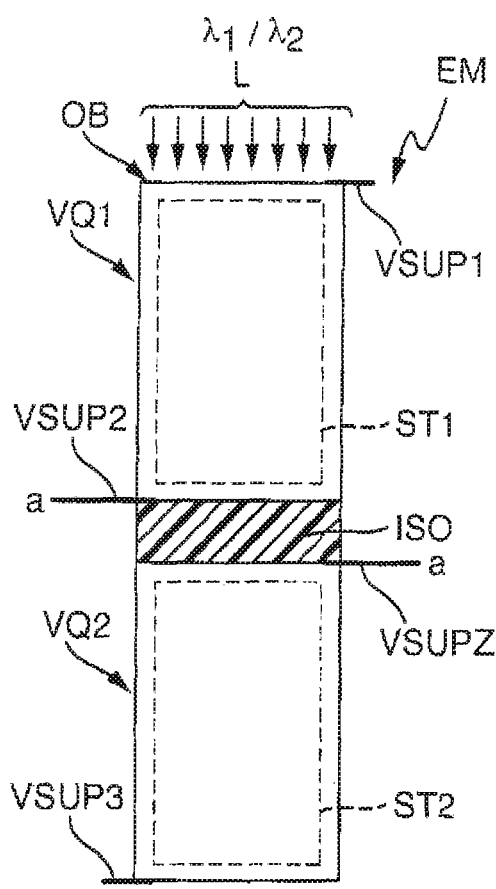
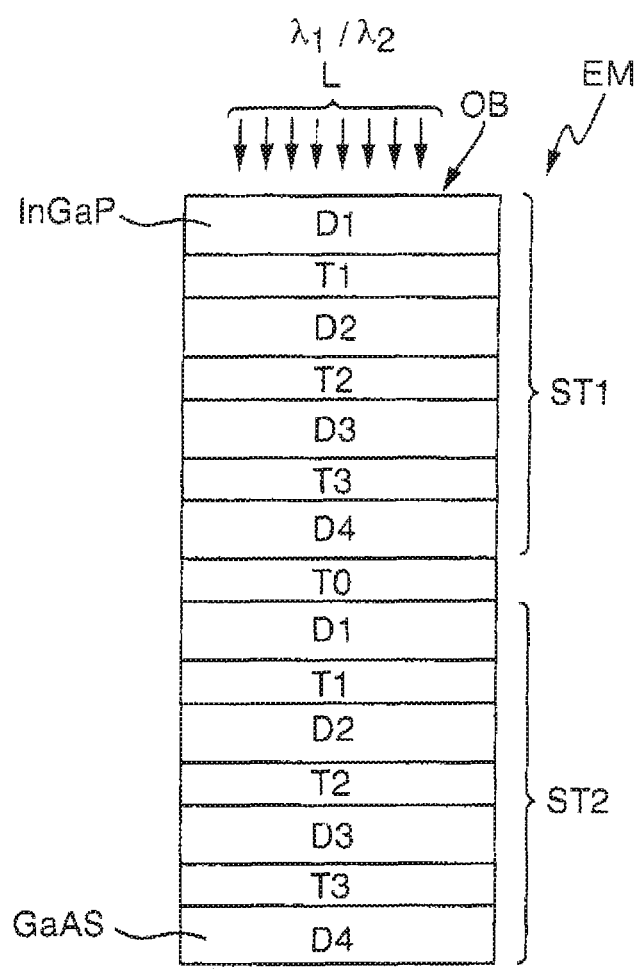
Fig. 1   Fig. 2
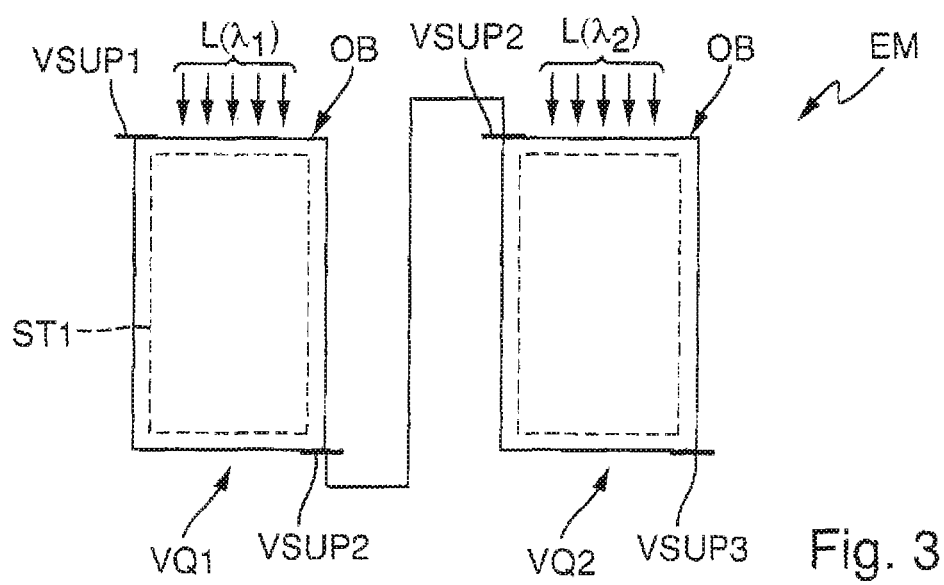
Fig. 3

OPTICAL RECEIVER COMPONENT

This nonprovisional application is a continuation of International Application No. PCT/EP2016/001638, which was filed on Oct. 4, 2016, and which claims priority to German Patent Application No. 10 2015 013 514.7, which was filed in Germany on Oct. 20, 2015, and which are both herein incorporated by reference.

BACKGROUND OF THE INVENTION

Field of the Invention

The present invention relates to an optical receiver component.

Description of the Background Art

An optical receiver component is known from DE 103 50 112 A1, which corresponds to U.S. Pat. No. 6,806,482. Furthermore, other optical receiver components and scalable voltage sources made of III-V materials are known from U.S. Pat. Nos. 4,127,862, 6,239,354, DE 10 2010 001 420 A1, from Nader M. Kalkhoran, et al., "Cobalt disilicide intercell ohmic contacts for multijunction photovoltaic energy converters," Appl. Phys. Lett. 64, 1980 (1994), and from A. Bett et al., "III-V Solar cells under monochromatic illumination," Photovoltaic Specialists Conference, 2008, PVSC '08. $33^{rd}$ IEEE, pages 1-5, ISBN: 978-1-4244-1640-0.

Furthermore, other optical receiver components are known from U.S. Pat. No. 4,996,577. Optical components are also known from US 2006/0048811, U.S. Pat. No. 8,350,208, and WO 2013/067969 A1.

SUMMARY OF THE INVENTION

It is therefore an object of the present invention to provide an optical receiver.

According to an exemplary embodiment of the invention, an optical receiver component comprises a first type of partial-voltage source with a first absorption edge and a second type of partial-voltage source with a second absorption edge, wherein the first absorption edge lies at a higher energy than the second absorption edge, and each partial-voltage source produces a partial voltage, provided a photon flux at a specific wavelength strikes the partial-voltage source and the two partial-voltage sources are connected in series, wherein, a first number N1 of series-connected sub-partial-voltage sources of the first type and a second number N2 of series-connected sub-partial-voltage sources of the second type are provided, wherein the first number N1 and/or the second number N2 are greater than one, and the respective deviation of the source voltages of the sub-partial-voltage sources among themselves is less than 20% in both types, and each sub-partial-voltage source comprises a semiconductor diode with a p-n junction, and a tunnel diode is formed between in each case two successive sub-partial-voltage sources, wherein the sub-partial-voltage sources and the tunnel diodes of each type are monolithically integrated in a stack-like manner and each monolithically integrated, stacked type has a top side and a bottom side.

The term 'monolithically integrated, stacked semiconductor layers' can indicate which layers are deposited sequentially in, for example, an epitaxial process. The term 'one type', i.e., the first type and the second type, in each case can designate sub-partial-voltage sources within the one type, which have a semiconductor material which within the particular type has the same or almost the same absorption edge. Also, each type can form a stack. In other words, the first type forms a first stack and the second type forms a second stack. The difference in the absorption edges between the two stacks is at least 50 nm, wherein the first stack always has an absorption edge at smaller wavelengths than the second stack. As a result, in a stacked arrangement, the first stack is always located above the second stack; i.e., light enters the first stack, passes through the first stack, and strikes the second stack, with the portion not absorbed in the first stack.

The expression 'substantially in connection with the comparison of the illumination surface on the stack top side with the size of the area of the first stack on the top side' can be understood to mean a difference in the area in particular of less than 20% or preferably of less than 10% or preferably of less than 5% or most preferably that the two areas are the same.

The term "light" for irradiating the stack top side can be understood to mean a light having a spectrum at wavelengths in the range of the absorption of the absorption layers. Monochromatic light as well is suitable which has a specific, i.e., absorbing, wavelength, therefore, a wavelength in the range of the absorption of the absorption layers.

The first type very basically can have a different semiconductor material than the second type, wherein the first type has the higher absorption edge or greater band gap energy than the second type and light with a shorter wavelength is absorbed in the first stack than in the second stack. The partial-voltage sources can comprise a III-V material as a semiconductor material.

An advantage is that with the integration of two stacks in a single housing, different light colors are received and each is converted to a voltage. If the two stacks are connected in series, the total voltage increases. A very space-saving and cost-effective design for a multicolor receiver can also be achieved. A further advantage is that a structural element, for example, in the form of a MOSFET, can be controlled with the high voltage of the receiver component.

In an embodiment, the first number N1 and/or the second number N2 are ≥three. This allows high voltages to be produced with each stack.

In an embodiment, the respective deviation of the source voltages of the sub-partial-voltage sources among themselves is less than 10% in both types.

In an embodiment, the semiconductor diodes within one type each comprise the same semiconductor material, wherein the semiconductor material of the diodes has the same crystalline composition and the stoichiometry can be almost or exactly the same. The first semiconductor material can comprise a compound of at least the elements, InGaP and/or AlGaAs, and the second semiconductor material comprises a compound of at least the elements, GaAs or InGaAs.

In an embodiment, the first semiconductor material is formed of the InGaP compound and the second semiconductor material of the GaAs or InGaAs compound; i.e., the compounds have no other connecting elements. The compounds generally can have dopants and in part also undesirable impurities.

In an embodiment, the first type of sub-partial-voltage sources as the first stack and the second type of sub-partial-voltage sources as the second stack are monolithically integrated together and form a common stack, i.e., a total stack. A tunnel diode can be formed between the first stack and the second stack, and the current flow flows through the entire stack; i.e., the individual layers form a series circuit.

In an embodiment, the first type of partial-voltage sources and the second type of partial-voltage sources form two stacks arranged next to one another; i.e., the first stack is placed next to the second stack. The two stacks are preferably placed on a common substrate. In this regard, the two stacks can be interconnected in series.

In an embodiment, the two types are placed in a stack-like manner one on top of the other, wherein a plate-shaped insulation layer is formed between the two stacks, i.e., an insulator with a thickness of less than 1 mm. In this regard, the two stacks are connected in series and the first stack is placed on the second stack and the light not absorbed by the first stack strikes the second stack.

In an embodiment, the first absorption edge lies at or below 750 nm and the second absorption edge at or above 820 nm. In a further refinement, one of the two absorption edges lies above 1000 nm.

In an embodiment, in the case of the first type and/or second type, the respective base area of the semiconductor stack has a quadrangular shape, wherein the largest edge length of the respective quadrilateral can be less than 2 mm and the area can be less than 4 $mm^2$ or less than 2 $mm^2$.

In an embodiment, the semiconductor diodes of both types of sub-partial-voltage sources have a p-doped absorption layer, wherein the p-absorption layer is passivated by a p-doped passivation layer having a larger band gap than the band gap of the p-absorption layer, and the semiconductor diodes of both types of sub-partial-voltage sources have an n-doped absorption layer, wherein the n-absorption layer is passivated by an n-doped passivation layer having a larger band gap than the band gap of the n-absorption layer.

In an embodiment, at least one of the tunnel diodes has a plurality of semiconductor layers with a higher band gap than the band gap of the p/n absorption layers, wherein the semiconductor layers with the higher band gap each include a material with a changed stoichiometry and/or different elemental composition than the p/n absorption layers of the semiconductor diode.

In embodiment, the light strikes the surface on the top side, wherein the size of the illuminated surface substantially corresponds to the size of the area of the top side.

In an embodiment, each type has a stack thickness of less than 12 µm, wherein at 300 K, the voltage of the partial-source voltages of the first and/or second stack is greater than 2.2 volts, if light with a wavelength smaller than the absorption edge strikes, and wherein in the light incidence direction from the top side toward the bottom side of each stack, the total thickness of the p and n absorption layers of a semiconductor diode increases from the uppermost semiconductor diode toward the lowermost semiconductor diode.

In embodiment, the partial-voltage sources have a circumferential, shoulder-shaped edge in the vicinity of the bottom side. The shoulder-shaped edge suppresses a short circuit in the diodes during metallization. In the case of a monolithic arrangement of two partial-voltage sources in a stack, a circumferential step should be formed only at the bottom side of a stack.

The edge can be step-shaped or formed as a step. In this regard, the surface of the edge or step preferably mostly has a planar area, wherein the normal of the surface of the edge or the step is parallel or nearly parallel to the normal of the surface of the first stack or the normal of the surfaces of the particular stack. It should be noted that the side face of the edge or step is formed predominantly or exactly perpendicular to the surface of the edge or step.

The border of the edge or step is at a distance of at least 5 µm and at most 500 µm from each of the four side faces of the first stack or in each case from the side faces of the plurality of stacks. Preferably, the distance range of the edge to the immediately adjacent side face is between 10 µm and 300 µm. In particular, the distance range is between 50 µm and 250 µm.

Preferably, the side faces of the first stack and in particular all side faces of the stack are planar and in particular formed perpendicular or substantially perpendicular. In particular, the normals to side faces compared to the normals of the adjacent edge surfaces or the normals of the stack faces lie in an angle range between 80° and 110°; i.e., the normals of a side face and the immediately adjacent edge surface are substantially orthogonal to each other. Preferably, the angle range is between 85° and 105°.

In an embodiment, at least one of the sub-partial-voltage sources of the partial-voltage sources of the first and/or second type comprises a semiconductor diode with a p-i-n junction. In other words, an intrinsic semiconductor layer is formed between the p-semiconductor layer and the n-semiconductor layer. Preferably, the intrinsic semiconductor layer is undoped. Intrinsic layers always should have a so-called background doping, which, for example, in the case of III-V epitaxially produced layers is in the range of 10e17 $N/cm^3$ and lower. In an embodiment, each of the sub-partial-voltage sources can have a semiconductor diode with a p-i-n transition.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a schematic view of a stacked arrangement with an insulator layer between the two stacks;

FIG. 2 shows a schematic view of a stacked arrangement with monolithic integration of the two stacks to form a total stack;

FIG. 3 shows a schematic view of an arrangement of two stacks next to one another;

DETAILED DESCRIPTION

Figure 4:
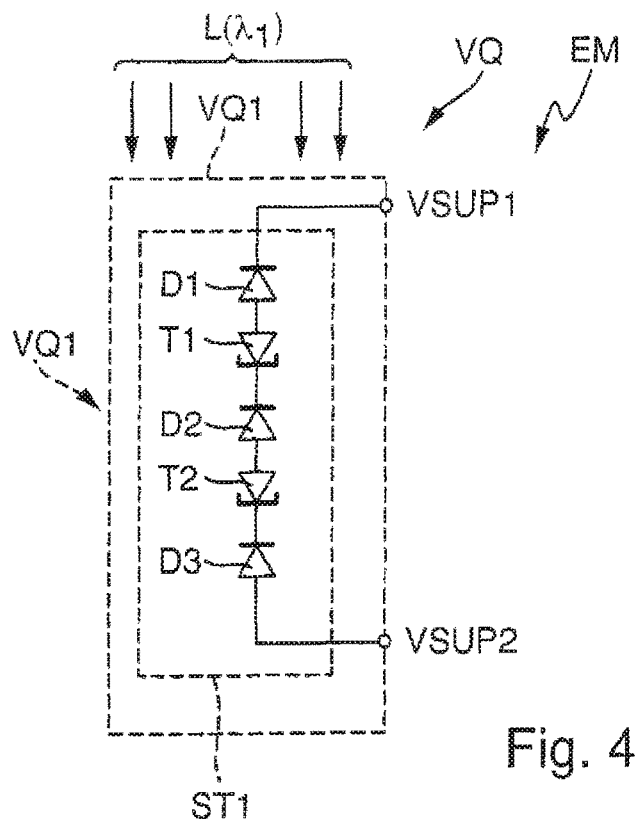
FIG. 4 shows an electrical equivalent circuit diagram of the first stack in with three stacked semiconductor diodes.

FIG. 1 shows a schematic view of a first embodiment of the invention of an optical receiver component EM with a stacked arrangement of a first stack ST1 and a second stack ST2. An insulator layer ISO is formed between first stack ST1 and second stack ST2. The structure has a non-positive connection.

Monochromatic or multichromatic light L strikes the top side of first stack ST1. Surface OB is largely or completely illuminated. It is preferred that the light L comprises a first wavelength lambda 1 and/or a second wavelength lambda 2. Insulator layer ISO must be at least transparent to second wavelength lambda 2. In the present embodiment, as the light L first passes through first stack ST1, only the unabsorbed portions of the light strike second stack ST2.

First stack ST1 has at the top side a first electrical connection VSUP1 and at the bottom side a second electrical connection VSUP2. Second stack ST2 has at the top side a first electrical connection VSUPZ and at the bottom side a second electrical connection VSUP3. First stack ST1 is connected in series to second stack ST2. For this purpose, second electrical connection VSUP2 of first stack ST1 is connected to first electrical connection VSUPZ of second stack ST2 (reference character a). Preferably, first stack ST1 is disposed in an integrally bonded manner on the top side of insulator layer ISO and the bottom side of insulator layer ISO is disposed in an integrally bonded manner on the top side of second stack ST2.

In the optical receiver component EM, a first type of sub-partial-voltage sources having a first absorption edge is formed in first stack ST1 and a second type of sub-partial-voltage sources having a second absorption edge in second stack ST2.

Each of the sub-partial-voltage sources has a semiconductor diode with a p-n junction. A tunnel diode is formed between each two successive sub-partial-voltage sources, wherein the sub-partial-voltage sources and the tunnel diodes of each type are monolithically integrated in a stack-like manner and each stacked monolithically integrated type has a top side and a bottom side.

The first type of sub-partial-voltage sources form a first partial-voltage source VQ1 and the second type of sub-partial-voltage sources form a second partial-voltage source VQ2. The first absorption edge lies at a higher energy than the second absorption edge, and each of the partial-voltage source produces a partial voltage if a photon flux with a specific wavelength strikes partial-voltage source VQ1, VQ2. If the two partial-voltage sources VQ1 and VQ2 are connected in series, the partial voltages of the two stacks ST1 and ST2 add up to form a total voltage.

First stack ST1 has a first number N1 of the first type of series-connected sub-partial-voltage sources, and the second stack has a second number N2 of the second type of series-connected sub-partial-voltage sources, wherein the first number N1 and/or the second number N2 are greater than one, and the respective deviation of the source voltages from the sub-partial-voltage sources among themselves is less than 20% in both types. By being able to vary the first number N1 and the second number N2, the two partial-voltage sources VQ1, VQ2 are scalable with respect to the voltage values.

The illustration in FIG. 2 shows a schematic view of the optical receiver component EM in a third embodiment of a stacked arrangement with a monolithic integration of the two stacks ST1 and ST2 to form a total stack, wherein first stack ST1 is disposed above, i.e., on second stack ST2. Only the differences from the illustration in FIG. 1 will be explained below.

In the present case, first stack ST1 has the first number N1 equal to four semiconductor diodes D1 to D4. One of the tunnel diodes T1 to T3 is formed in each case between two successive semiconductor diodes D1 to D4. First stack ST1 is located on the side of receiver component EM facing the illumination. The semiconductor diodes of the first stack comprise an InGaP and/or AlGaAs material. Second stack ST2 has the second number N2 equal to four semiconductor diodes D1 to D4. One of the tunnel diodes T1 to T3 is formed in each case between two successive semiconductor diodes D1 to D4. A further tunnel diode T0 is formed between the two stacks ST1 and ST2. With regard to the direction of illumination, the second stack is located below the first stack. The semiconductor diodes of the second stack comprise a GaAs and/or InGaAs material. As there is a monolithic integration, all structural elements of the two stacks ST1 and ST2 are connected in series.

The illustration of FIG. 3 shows a schematic view of a second embodiment of the invention of optical receiver component EM with stacks ST1 and ST2 disposed next to one another. Only the differences from the illustration in FIG. 1 will be explained below.

Light L with the first wavelength lambda 1 strikes first stack ST1 at the top side, and light L with the second wavelength lambda 2 strikes the top side of second stack ST2. The two stacks ST1 and ST2 or the two partial-voltage sources VQ1 and VQ2 are connected in series; i.e., the total voltage can be tapped at first electrical connection VSUP1 of first stack ST1 and at second electrical connection VSUP3 of the bottom side of second stack ST2.

The illustration in FIG. 4 shows an electrical equivalent circuit of first stack ST1 or first partial-voltage source VQ1 in an embodiment with three stacked semiconductor diodes D1 to D3. Accordingly, first stack ST1 has a series connection of first diode D1 and first tunnel diode T1 and second diode D2 and second tunnel diode T2 and third diode D3. The first voltage connection VSUP1 is formed on the top side of first stack ST1 and the second voltage connection VSUP2 is formed on the bottom side of first stack ST1.

In the present case, the voltage of first stack ST1 substantially consists of the sub-partial-voltages of the individual diodes D1 to D3. For this purpose, first stack ST1 must be exposed to a photon flux, i.e., the light L.

First stack ST1 of diodes D1 to D3 and tunnel diodes T1 and T2 is designed as a monolithically formed block, preferably made of a III-V material. Semiconductor diodes D1 to D3 are preferably made of the same semiconductor material. Tunnel diodes T1 and T2 are also preferably of identical construction.

Figure 5:
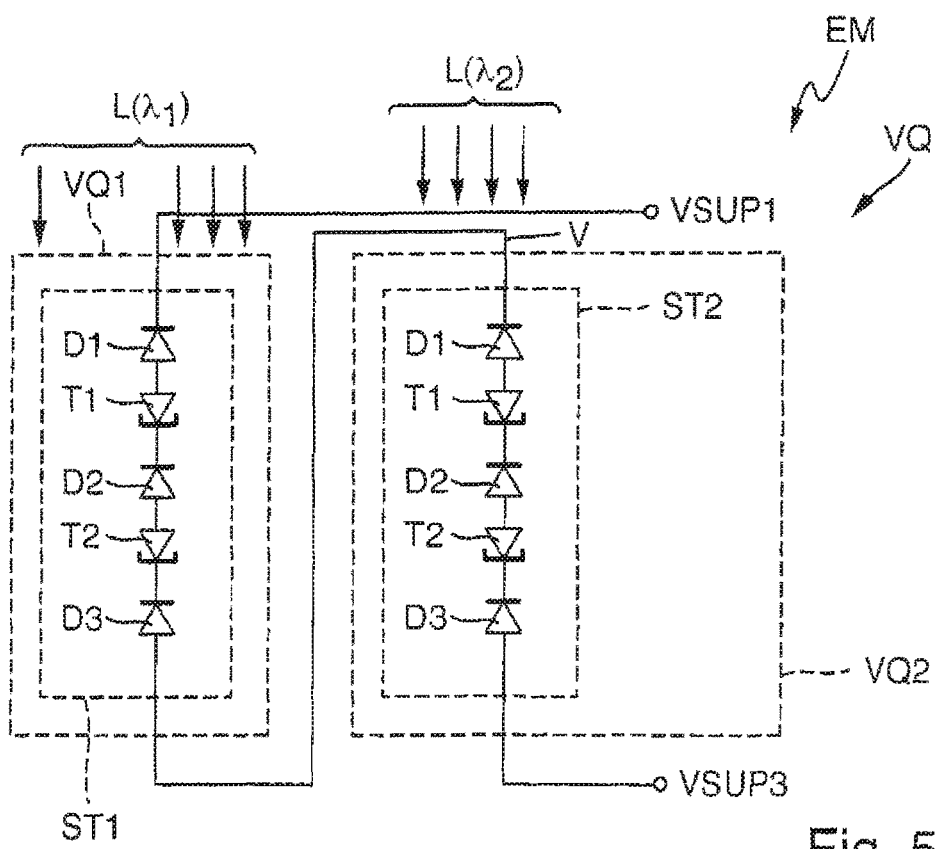
FIG. 5 shows an electrical equivalent circuit diagram of the first stack and the second stack, in each case with three stacked semiconductor diodes, wherein the two stacks are connected in series.

The illustration in FIG. 5 shows an electrical equivalent circuit diagram of first stack ST1 and second stack ST2, in each case in an embodiment with three stacked semiconductor diodes D1 to D3, wherein the two stacks ST1 and ST2 are connected in series. Only the differences from the illustration in FIG. 4 will be explained below.

Like first stack ST1, second stack ST2 has a series connection of three diodes with tunnel diodes formed therebetween. Both stacks ST1 and ST2 are connected to each other in series, so that the voltage of first partial-voltage source VQ1 of first stack ST1 and the voltage of second partial-voltage source VQ2 of second stack ST2 add up, provided first stack ST1 is exposed to light L of first wavelength lambda 1 and second stack ST2 is exposed to light L with second wavelength lambda L2.

In an embodiment, the two stacks ST1 and ST2 have a different number of diodes each connected in a series connection. In a further embodiment, at least the first stack ST1 and/or the second stack ST2 have ≥three diodes connected in a series connection. As a result, the voltage level of voltage source VQ can be scaled. Preferably, the number of diodes is in a range between four and eight.

Figure 6:
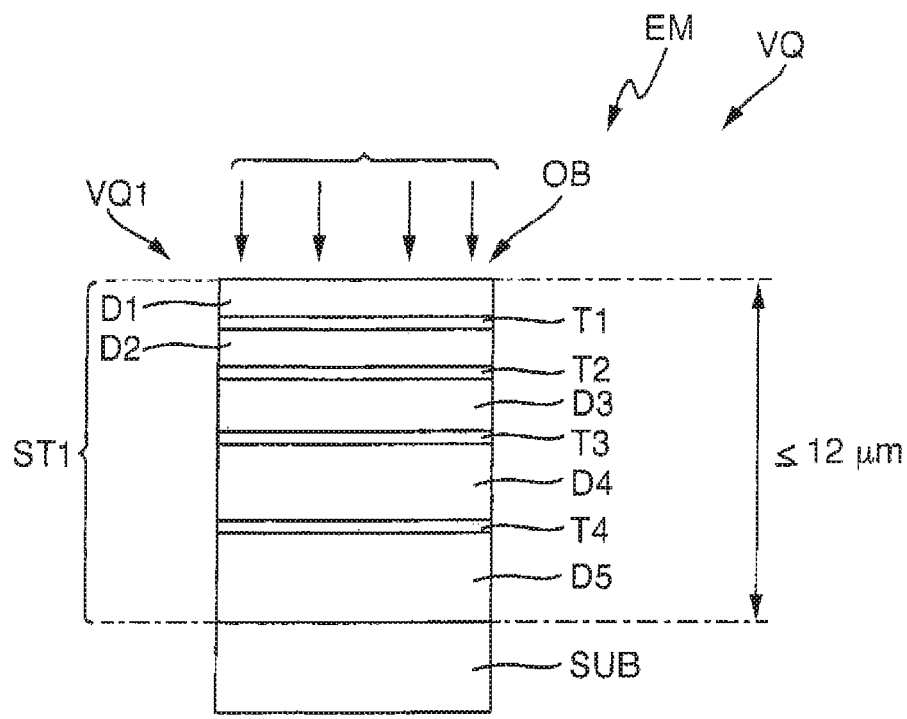
FIG. 6 shows a schematic view of five monolithically integrated semiconductor diodes using the example of the first stack, wherein the thickness of the individual semiconductor diodes increases.

The illustration in FIG. 6 shows an embodiment of an advantageous linking together of semiconductor layers to first stack ST1. Only the differences from the illustration in FIG. 4 will be explained below. First stack ST1 comprises a total of five series-connected sub-partial-voltage sources formed as diodes D1 to D5.

The light L strikes the surface OB of first diode D1. A tunnel diode T1-T4 is formed in each case between two successive diodes D1-D5. With increasing distance of the individual diodes D1 to D5 from the surface OB, the thickness of the absorption region increases, so that the lowermost diode D5 has the thickest absorption region. Overall, the total thickness of first stack ST1 is less than or equal to 12 µm. A substrate SUB is formed below the lowermost diode D5.

Figure 7:
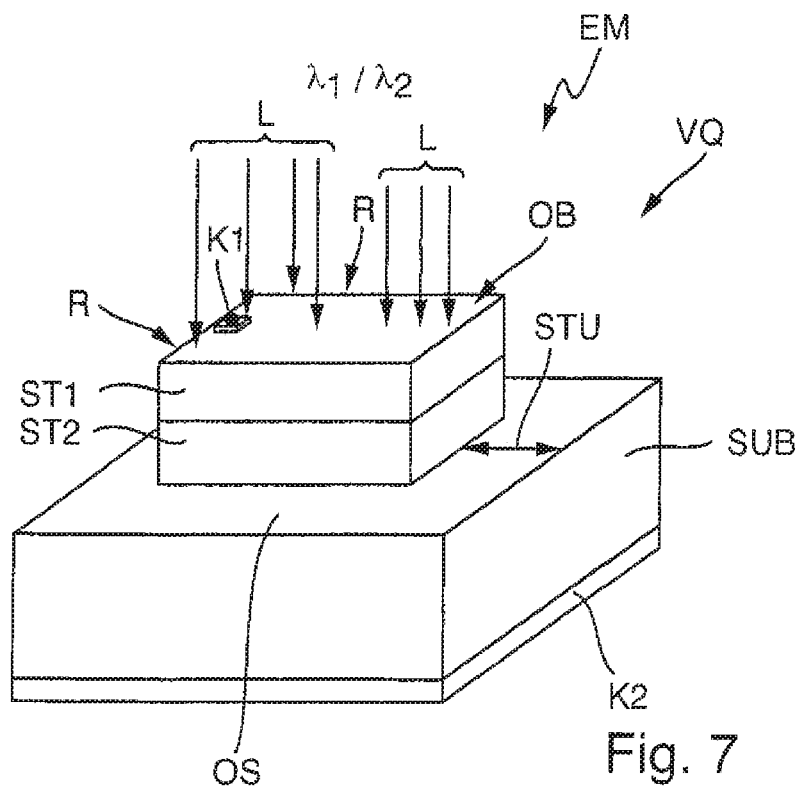
FIG. 7 is a schematic view of a total stack arranged on a common substrate.

The illustration in FIG. 7 shows a schematic view of a monolithically formed total stack arranged on a common substrate SUB with a peripheral shoulder-shaped step STU. Only the differences to the preceding figures will be described below.

On the surface OB of first stack ST1, a first metallic connection contact K1 is formed on the edge R. Second stack ST2 is disposed below first stack ST1. First connection contact K1 is connected to first voltage connection VSUP1. Substrate SUB has a top side OS, wherein top side OS of substrate SUB is integrally bonded to the bottom side of second stack ST2.

A thin nucleation layer and a buffer layer can be epitaxially produced on substrate SUB before the lowermost diode of second stack ST2 is placed on substrate SUB and integrally bonded to top side OS of substrate SUB. Top side OS of substrate SUB has a larger surface than the area on the bottom side of second stack ST2. As a result, circumferential step STU is formed. A second full-surface metallic contact K2 is formed on the bottom of substrate SUB. Second connection contact K2 is connected to the second voltage connection of second stack ST2 VSUP3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An optical receiver component, comprising:
a first type of partial-voltage source with a first absorption edge;
a second type of partial-voltage source with a second absorption edge, the first absorption edge lying at a higher energy than the second absorption edge, the first type of partial-voltage source and the second type of partial-voltage source each producing a partial voltage and being connected in series,
wherein the first type of partial-voltage source forms a first stack and the second type of partial-voltage source forms a second stack,
wherein a difference in the first absorption edge and the second absorption edge between the first stack and the second stack is at least 50 nm,
wherein the first stack and the second stack are integrated into a single housing to form a multicolor receiver,
wherein the first type of partial-voltage source comprises a first semiconductor material and the second type of partial-voltage source comprises a semiconductor material different from the first semiconductor material,
wherein a first number N1 of series-connected sub-partial-voltage sources of the first type and a second number N2 of series-connected sub-partial-voltage sources of the second type are provided,
wherein the first number N1 and the second number N2 are greater than one,
wherein a respective deviation of the source voltages of the sub-partial-voltage sources among themselves is less than 20% in both types, and each sub-partial-voltage source comprises a semiconductor diode with a p-n junction,
wherein a tunnel diode is formed between two successive sub-partial-voltage sources in each of the series-connected sub-partial-voltage sources of the first type and the series-connected sub-partial-voltage sources of the second type, and
wherein the sub-partial-voltage sources and the tunnel diodes of the first type and the second type are monolithically integrated in a stack and the monolithically integrated stack has a top side and a bottom side.

2. The optical receiver component according to claim 1, wherein the first number N1 and/or the second number N2 are ≥three.

3. The optical receiver component according to claim 1, wherein the respective deviation of the source voltages of the sub-partial-voltage sources among themselves is less than 10% in both types.

4. The optical receiver component according to claim 1, wherein the semiconductor diodes within one type each comprise the same semiconductor material.

5. The optical receiver component according to claim 1, wherein the first type of sub-partial-voltage sources and the second type of sub-partial-voltage sources are monolithically integrated together and form a common stack and a tunnel diode is formed between the first type and the second type.

6. The optical receiver component according to claim 5, further comprising a circumferential step at the bottom side of the common stack.

7. The optical receiver component according to claim 1, wherein the first type of sub-partial-voltage sources and the second type of sub-partial-voltage sources form two stacks arranged next to one another and the two stacks are placed on a common substrate.

8. The optical receiver component according to claim 1, wherein the first and second types are placed in a stack-like manner one on top of the other and a plate-shaped insulator with a thickness of less than 1 mm is formed between the two stacks.

9. The optical receiver component according to claim 1, wherein the first absorption edge is formed below 750 nm and the second absorption edge lies above 820 nm.

10. The optical receiver component according to claim 1, wherein at least one of the two absorption edges lies above 1000 nm.

11. The optical receiver component according to claim 1, wherein the partial-voltage sources comprise a III-V material as a semiconductor material.

12. The optical receiver component according to claim 1, wherein the semiconductor diode of the first type comprises an InGaP and/or AlGaAs material and the semiconductor diode of the second type comprises a GaAs material or an InGaAs material.

13. The optical receiver component according to claim 1, wherein, in the first type and/or second type, the respective base area of the semiconductor stack has a quadrangular shape and a largest edge length of the respective quadrangle is less than 2 mm and an area is less than 4 mm$^2$ or less than 2 mm$^2$.

14. The optical receiver component according to claim 1, wherein the semiconductor diodes of the first and second types of sub-partial-voltage sources have a p-doped absorption layer, wherein the p-absorption layer is passivated by a p-doped passivation layer having a larger band gap than a band gap of the p-absorption layer, and the semiconductor diodes of the first and second types of sub-partial-voltage sources have an n-doped absorption layer, wherein the n-absorption layer is passivated by an n-doped passivation layer having a larger band gap than a band gap of the n-absorption layer.

15. The optical receiver component according to claim 1, wherein at least one of the tunnel diodes has a plurality of semiconductor layers with a higher band gap than a band gap of the p/n absorption layers, and wherein the semiconductor layers with the higher band gap are formed of a material with a changed stoichiometry and/or different elemental composition than the p/n absorption layers of the semiconductor diode.

16. The optical receiver component according to claim 1, wherein the first type of partial-voltage source forms a first stack and the second type of partial-voltage source forms a second stack or wherein the first and second types form a common stack, wherein the common stack is monolithic or composite, and wherein the first stack is disposed on the second stack and the light not absorbed by the first stack strikes the second stack.

17. The optical receiver component according to claim 1, wherein a size of an illuminated surface substantially corresponds to a size of an area of the top side.

18. The optical receiver component according to claim 1, wherein each partial-voltage source type has a stack thickness of less than 12 μm and at 300 K, wherein the partial-source voltages of the first and/or second stack are greater than 2.2 volts if light with a wavelength less than the absorption edge strikes, and wherein in a light incidence direction from the top side toward the bottom side of each stack, a total thickness of the p and n absorption layers of a semiconductor diode increases from the uppermost semiconductor diode toward the lowermost semiconductor diode.

19. The optical receiver component according to claim 1, wherein the partial-voltage sources have a circumferential step in a vicinity of the bottom side.

20. The optical receiver component according to claim 1, wherein at least one of the sub-partial-voltage sources comprises a semiconductor diode with a p-i-n junction.

* * * * *